United States Patent [19]

Burns et al.

[11] 4,355,278

[45] Oct. 19, 1982

[54] METHOD FOR TESTING AND ANALYZING SURFACE ACOUSTIC WAVE INTERDIGITAL TRANSDUCERS

[75] Inventors: Daniel J. Burns, Rome, N.Y.; James C. Sethares, Burlington, Mass.; Gerald G. Sweet, Rome, N.Y.

[73] Assignee: The United States of America as represented by the Secretary of the Air Force, Washington, D.C.

[21] Appl. No.: 175,793

[22] Filed: Aug. 6, 1980

[51] Int. Cl.³ ............................................. G01R 31/04
[52] U.S. Cl. ................................. 324/158 R; 324/51; 324/96; 350/331 R; 340/784
[58] Field of Search ............ 73/1 DV; 324/51, 158 R, 324/73 R, 96, 415; 350/331 R; 340/784, 783

[56] References Cited

U.S. PATENT DOCUMENTS 3,934,199 1/1976 Channin .......................... 324/158 R

OTHER PUBLICATIONS

IBM Technical Disclosure Bulletin, "Detecting Short Circuits in Multilayer Printed-Circuit Boards", Delarue et al., vol. 21, No. 3, 8/78.

Primary Examiner—Anthony V. Ciarlante
Attorney, Agent, or Firm—Donald J. Singer; Willard R. Matthews

[57] ABSTRACT

Nondestructive testing and analyzing of surface acoustic wave (SAW) interdigital transducers is accomplished by observing electro-optic changes in a layer of liquid crystals produced by the effects of electric fields resulting from an electrical potential applied to the transducer. A display cell comprising a liquid crystal layer covered with a gold coated glass coverplate is fabricated on the surface of the SAW substrate under test. The assembled display cell is positioned for viewing under a microscope equipped for vertical illumination by a light source and a beam splitter. Polarizers are positioned in the illumination and viewing paths. An electrical potential is applied to the SAW device transducers and in some instances to the coverplate gold coat. Electro-optic effects produced in the liquid crystal by the electric field effects of the applied electrical potential are viewed through the microscope and are analyzed and interpreted.

6 Claims, 3 Drawing Figures

METHOD FOR TESTING AND ANALYZING SURFACE ACOUSTIC WAVE INTERDIGITAL TRANSDUCERS

STATEMENT OF GOVERNMENT INTEREST

The invention described herein may be manufactured and used by or for the Government for governmental purposes without the payment of any royalty thereon.

BACKGROUND OF THE INVENTION

This invention relates to surface acoustic wave device testing and in particular to nondestructive testing of interdigital transducers on surface acoustic wave device substrates.

Surface acoustic wafe devices often represent desirable new or improved alternate technology used for electrical filtering, generation and analog computing in such applications as radar, information processing and guidance systems. It is therefore desirable that there be developed a capability for rapid, inexpensive and accurate testing of surface acoustic wave transducers and other SAW components produced for use in Air Force and other systems. It is also desirable that techniques developed be adaptable to studying charge distributions which exist on interdigital fingers under various electrical operating conditions for the purpose of improving device design.

Presently it is extremely difficult if not impossible to detect all defects which will cause faulty or degraded operation of SAW transducers optically (or through the use of scanning electron microscopy) or by electrical testing.

The present invention is a test method that overcomes these deficiencies and solves the problem of determining if a SAW transducer has any defective fingers. It does this nondestructively so that the method can be used as a production line screen test during the SAW device manufacturing process before the device is assembled into a package. The test method allows determination based on a simple optical inspection of whether the SAW transducer tested contains defects which cause portions of interdigital electrode fingers to be electrically poorly connected or not connected to their respective external device terminals. It allows that determination without the need to functionally test the SAW device in a conventional manner or even to mount the device in a suitable package with external electrical connections. The required electrical connections can be made using external probes. The packaging and functional testing of SAW devices is very expensive and time consuming compared to the method of the invention. The method of the invention may also be useful in studying charge distributions which exist on fingers under various electrical operating conditions for the purpose of improving device designs.

SUMMARY OF THE INVENTION

The invention comprises a method for testing and analyzing Surface Acoustic Wave (SAW) interdigital transducers. The method consists of the steps of applying field effect liquid crystal to the transducer bearing surfactant coated substrate surface; covering the liquid crystals with a thin gold coated glass coverplate; viewing the prepared device using polarized light and a magnifying optical system with an analyzer in the viewing path; applying an electrical potential across the interdigital transducer terminals; and finally interpreting the resulting information contained in the image produced by the effects of the electrical fields associated with the interdigital transducer on the polarized light transmission characteristics in localized areas of the liquid crystal layer.

The method allows nondestructive testing of extremely fine geometry (1 $\mu$m) transducers using readily available materials and equipment. The test results are easy to produce and interpret. Portions of each interdigital transducer finger which are functional (good) appear to light up in the displayed image. Those portions of fingers which are open circuited (defective) appear dark.

It is a principal object of the invention to provide a new and improved method for testing and analyzing surface acoustic wave interdigital transducers.

It is another object of the invention to provide a method for testing SAW interdigital transducers that is nondestructive and adaptable to production line screen testing during device manufacturing process.

It is another object of the invention to provide a method for rapid, inexpensive and accurate testing of surface acoustic wave transducers.

It is another object of the invention to provide a method of testing and analyzing SAW transducers that permits studying charge distributions that exist on interdigital fingers under various electrical operating conditions.

These together with other objects, features and advantages of the invention will become more readily apparent from the following detailed description when taken in conjunction with the accompanying drawings.

DETAILED DESCRIPTION OF THE PREFERRED EMBODIMENT

Figure 1:
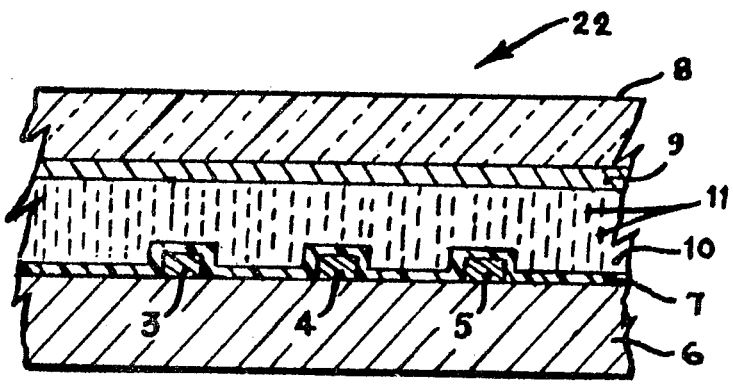
FIG. 1 is a cross sectional view of a portion of a liquid crystal display cell fabricated on a SAW transducer with no electrical bias applied to the transducers.
Figure 2:
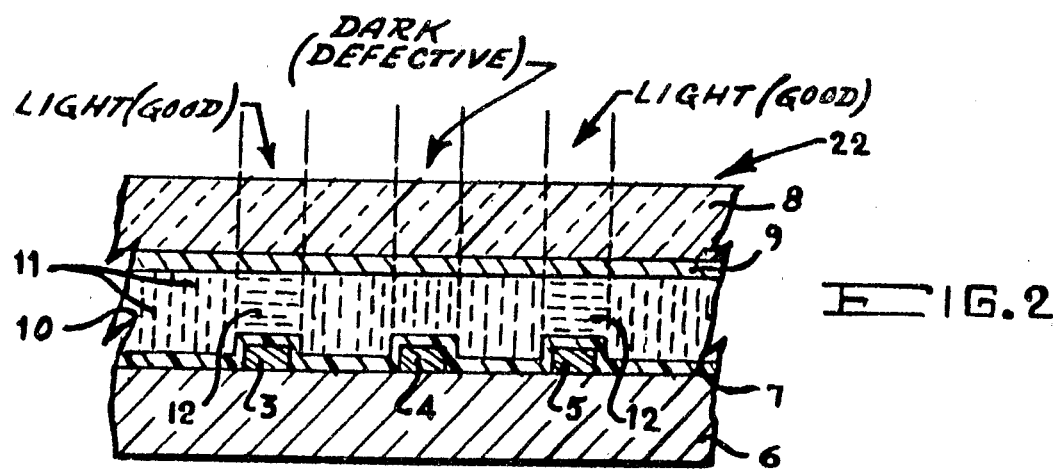
FIG. 2 is a cross sectional view of a portion of a liquid crystal display cell fabricated on a SAW transducer with electrical bias applied to the transducer terminals.

Referring now to FIGS. 1 and 2, there is illustrated thereby sections of a liquid crystal display cell (test transducer 22) with no electrical bias and with electrical bias applied to the transducer. This comprises SAW substrate 6, transducer fingers 3, 4, 5, surfactant layer 7, liquid crystal layer 10, and glass coverplate 8 having a gold film 9 on one of its surfaces.

Figure 3:
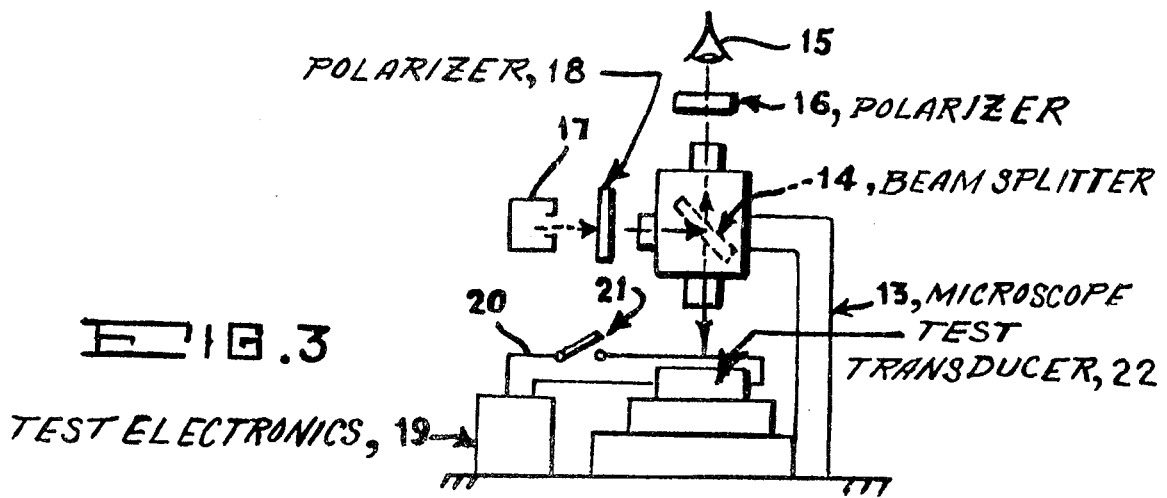
FIG. 3 illustrates apparatus for testing a SAW transducer with the liquid crystal test method of the invention.

The test euqipment used in performing the method of the invention is illustrated in FIG. 3. It comprises microscope 13, beam splitter 14, polarizer 16, light source 17, polarizer 18, test electronics 19, electrical connections 20 and switch 21.

The method of the invention is described as follows:

A liquid crystal display cell is fabricated on the surface of the SAW device substrate to be tested as shown in FIG. 1, upon which a transducer electrode pattern 3, 4, 5 has been deposited and patterned during previous manufacturing steps. Electrode structure is not drawn to scale. A thin layer of the surfactant 7 is first applied to the surface. A suitable solution is made with 5% by weight lecithin dissolved in 95% by weight trichloroethylene. A drop in this solution is applied to the surface and the device is spun rapidly for two or three seconds to obtain a thin coating. (This spinning procedure is common prior art.) The lecithin coating must be baked at about 100° C. for an hour, or dried by some other method such as a heat lamp or overnight drying. The purpose of the surfactant coating is to cause liquid crystal molecules applied to the coated surface to orient in such a manner that the long axis of molecules of the material are perpendicular to the SAW device surface. (The ends of the rod-like liquid crystal molecules attach themselves to the coated surface, resulting in a vertical or "homogeneous" alignment mode as illustrated by lines 11 representing the aligned molecular long axis direction.) This special alignment is essential for a usable display effect when a liquid crystal such as N-(P-methoxybenzildene)-p-butylaniline (called MBBA) is used in the cell. The invention should also comprehend the use of liquid crystals other than MBBA, other alignment modes and other means of achieving those alignment modes. A glass coverplate 8 must also be fabricated by depositing a layer of gold or other suitable material 9 on one of its surfaces. Vacuum evaporation or sputtering of gold from a source direction normal to the surface being coated has been used in the prior art to achieve suitable thin films. The film may be about 200 Å thick. The film causes the required homogeneous liquid crystal alignment on the coverplate surface. The glass may be about 0.005 inches thick, and it must be cut to a size which will cover the active area of the SAW transducer without preventing electrical contact to the terminals of the device.

One way to assemble the cell is to place the prepared coverplate 8 gold side down directly on the treated surface 7 of the SAW transducer and then to introduce liquid crystal 10 between the bounding surface of the cell. This can be accomplished by using a small brush applicator made by taping a few bristles from a fine laboratory acid brush to the end of a paperclip. The applicator can be dipped in liquid crystal material and touched to the treated surface of the SAW device at the edge of the coverplate. Liquid crystal material from the brush will be drawn in between the bounding surfaces of surfactant 7 and gold film 9 by capillary attraction. This step may be repeated until the whole area of the display cell is coated with liquid crystal.

Referring now to FIG. 3 the complete display cell assembly can be positioned and focused for viewing under a microscope 13 equipped for vertical illumination by means of a light source 17 and beam splitter 14. A polarizer 18 is placed in the illumination path and another polarizer 16 is placed in the viewing path of the observer 15, recording media, or other means of interpreting the information in the display. Polarizer 16 is rotated until the darkest image is obtained, usually this corresponds to a 90° rotation with respect to polarizer 17. Electrical connections 20 are then made to the two (or more) terminals of the test transducer 22 by switch 21. Connection may also be made to gold layer 9. Electrical potentials are applied through these connections by test electronics 19. The test electronics need only be simple 9 V transistor radio battery or may be a variable voltage source or pulse generator.

FIG. 2 illustrates the effects which occur in the liquid crystal immediately above electrically connected (good) transducer fingers 3 and 5 and electrically open (defective) transducer finger 4. The light/dark patterns are observed only under the previously mentioned illumination and observation conditions. The electro-optic effect is described in the prior art. The basic principle of operation is a reorientation from the vertical to the horizontal direction of the long axis of the rod like liquid crystal molecules in localized areas of liquid crystal. This reorientation is illustrated by lines 12 representing the reoriented molecular long axis direction (FIG. 2) and occurs as a result of electric fields due to charge distributions on the underlying structures. The molecular long axis direction tends to align perpendicular to the local electric field for MBBA liquid crystal. This reorientation results in a corresponding localized change in the index of refraction of the film 10 and thus a change in the film's light transmission characteristics.

While the invention has been described in one presently preferred embodiment it is understood that the words which have been used are words of description rather than words of limitation and that changes within the purview of the appended claims may be made without departing from the scope and spirit of the invention in its broader aspects.

What is claimed is:

1. The method of testing and analyzing the electrical characteristics of interdigital transducers on surface acoustic wave substrates comprising the steps of applying a surface treatment to the transducer bearing surface of a surface acoustic wave substrate for the purpose of producing a specific molecular alignment in liquid crystals applied to the surface, fabricating a glass cover plate that is substantially co-extensive with the transducer bearing surface of said substrate, applying a gold coat to one surface of said glass cover plate for the purpose of producing a specific molecular alignment in liquid crystals applied to the surface, placing said glass cover plate on the treated surface of said substrate, the gold coated glass cover plate surface being adjacent to said treated substrate surface, inserting liquid crystal material into the area between said glass cover plate and the substrate surface, positioning the substrate-cover plate assembly for viewing under a microscope, directing, from a light source, a light beam through said microscope and through said cover plate, polarizing the light from said light source, polarizing the light received through said microscope, applying an electrical potential to the transducers, viewing through said microscope the electro-optic effects produced in said liquid crystal by the electric field effects of said applied electrical potential; and analyzing said electro-optic effects.

2. The method of testing and analyzing the electrical characteristics of interdigital transducers on surface acoustic wave substrates defined in claim 1 wherein said surface treatment is application of a solution made with 5% by weight lecithin dissolved in 95% by weight trichlorethylene said solution being dried before application of liquid crystal material.

3. The method of testing and analyzing the electrical characteristics of interdigital transducers on surface acoustic wave substrates defined in claim 2 wherein said liquid crystal material is MBBA liquid crystal.

4. The method of testing and analyzing the electrical characteristics of interdigital transducers on surface acoustic wave substrates defined in claim 1 wherein the crystal molecules of said liquid crystal material have a discrete homogeneous alignment.

5. The method of testing and analyzing the electrical characteristics of interdigital transducers on surface acoustic wave substrates defined in claim 1 wherein the crystal molecules of said liquid crystal material are aligned normal to the plane of said interdigital transducers.

6. The method of testing and analyzing the electrical characteristics of interdigital transducers on surface acoustic wave substrates defined in claim 1 including the step of applying electrical potentials to said film of metallic material.

* * * * *